(12) United States Patent
Krupar et al.

(10) Patent No.: US 12,099,079 B2
(45) Date of Patent: Sep. 24, 2024

(54) APPARATUS FOR ANALYSING CURRENTS IN AN ELECTRICAL LOAD, AND LOAD HAVING SUCH AN APPARATUS

(71) Applicant: Elmos Semiconductor SE, Dortmund (DE)

(72) Inventors: Jörg Krupar, Stolpen (DE); Michael Fiedler, Dresden (DE); Christian Wagenknecht, Dresden (DE)

(73) Assignee: Elmos Semiconductor SE, Dortmund (DE)

( * ) Notice: Subject to any disclaimer, the term of this patent is extended or adjusted under 35 U.S.C. 154(b) by 49 days.

(21) Appl. No.: 17/439,220

(22) PCT Filed: Mar. 19, 2020

(86) PCT No.: PCT/EP2020/057675
§ 371 (c)(1),
(2) Date: Sep. 14, 2021

(87) PCT Pub. No.: WO2020/188054
PCT Pub. Date: Sep. 24, 2020

(65) Prior Publication Data
US 2022/0163567 A1    May 26, 2022

(30) Foreign Application Priority Data
Mar. 20, 2019 (DE) ............. 10 2019 107 135.6

(51) Int. Cl.
*G01R 15/14* (2006.01)
*G01R 29/027* (2006.01)
*H03K 17/16* (2006.01)

(52) U.S. Cl.
CPC ......... *G01R 15/146* (2013.01); *G01R 29/027* (2013.01); *H03K 17/161* (2013.01)

(58) Field of Classification Search
CPC .................. G01R 15/146; G01R 19/2513; G01R 29/027; H03K 17/002; H03K 17/0822;
(Continued)

(56) References Cited

U.S. PATENT DOCUMENTS

| 5,343,078 A | 8/1994 | Bullmer |
| 7,415,622 B2 * | 8/2008 | Masson ............... G06F 1/26 713/340 |

(Continued)

FOREIGN PATENT DOCUMENTS

| DE | 4234421 A1 | 4/1994 |
| DE | 102017001179 A1 | 5/2018 |

OTHER PUBLICATIONS

International Search Report dated Jun. 26, 2020 re PCT/EP2020/057675 (5 pages).
(Continued)

*Primary Examiner* — Ryan Johnson
*Assistant Examiner* — Colleen J O Toole
(74) *Attorney, Agent, or Firm* — Michael J. McCandlish; Mindful IP Law PLLC

(57) ABSTRACT

An apparatus for analyzing currents in an electric load is provided with a current measuring circuit, which can be connected in series with the parallel circuit of the load branches, and a detector for detecting a change in the current when the switching element in a load branch is switched on or off. The apparatus also has an analysis unit which is connected to the control unit and to the detector and analyzes the temporal correlation of a control signal for switching a switching element in a load branch on or off with the detection of the change in the current and/or analyzes the change in the current at a plurality of times of switching a relevant switching element in a load branch or the switching elements in a plurality of load branches.

20 Claims, 6 Drawing Sheets

(58) Field of Classification Search
CPC ........... H03K 17/08122; H03K 17/161; H03K 17/296; H03K 17/693; H03K 2217/0027
See application file for complete search history.

(56) References Cited

U.S. PATENT DOCUMENTS

| | | | | |
|---|---|---|---|---|
| 9,742,277 | B2* | 8/2017 | Hirler | H02M 3/158 |
| 10,852,737 | B2* | 12/2020 | Szubbocsev | B60L 58/16 |
| 2003/0034770 | A1 | 2/2003 | Shenai et al. | |
| 2008/0024012 | A1* | 1/2008 | Qahouq | H03K 17/167 |
| | | | | 307/126 |
| 2014/0142724 | A1 | 5/2014 | Park et al. | |
| 2014/0333294 | A1 | 11/2014 | Bruel | |

OTHER PUBLICATIONS

Written Opinion dated Jun. 26, 2020 re PCT/EP2020/057675 (6 pages).
Gajula Kaushik et al. article entitled "Detection of Series DC Arc on a Distribution Node Using Discrete-Time Parameter Identification Techniques," 2019 IEEE Applied Power Electronics Conference and Exposition (APEC), IEEE, Mar. 17, 2019 (Mar. 17, 2019), pp. 3007-3012, DOI: 10.1109/APEC.2019.872250, XP033555090.
First Office Action (with English translation) issued on Dec. 14, 2023 in correlated Chinese Application No. 202080022646.3.

\* cited by examiner

APPARATUS FOR ANALYSING CURRENTS IN AN ELECTRICAL LOAD, AND LOAD HAVING SUCH AN APPARATUS

CROSS REFERENCE TO RELATED APPLICATIONS

The present patent application is a national stage of, and claims priority to, Patent Cooperation Treaty Application No. PCT/EP2020/057675, filed on Mar. 19, 2020, which application claims the priority of the German patent application 10 2019 107 135.6 of 20 Mar. 2019 the disclosures of which are incorporated by reference in the present patent application.

BACKGROUND

The disclosure relates to an apparatus for switched control of a plurality of loads with the aid of switching elements.

In the field of electromobility, the reliable control of electric consumer loads in a vehicle has become more and more important. In particular in the case of large ohmic loads a fault state cannot always be clearly distinguished from normal operation. Moreover, the larger amounts of energy lead to an increasing EMC radiation. However, the present disclosure can also be applied to other fields. The disclosure presented here also includes the use of AI technologies for controlling such an apparatus.

In prior art, a number of systems having the structure shown FIG. 1 exist.

FIG. 1 schematically shows the circuit of an electric consumer load having a plurality, i.e. n load branches (n being a positive integer larger than or equal to 1) whose respective loads RL1 to RLn are periodically switched on and off by a switching signal generating unit CTR having switching elements $T_1$ to $T_n$, here n transistors, for example, for controlling their mean output.

The n switching elements $T_1$ to $T_n$ receive corresponding control signals G1 to Gn. These n control signals G1 to Gn are generated in a corresponding switching signal generating unit CTR. As a rule, the control signals G1 to Gn are generated in a time-shifted manner by the switching signal generating unit CTR for generating a mean current consumption as constant as possible at the supply unit V.

In the systems shown in FIG. 1 a current measuring means having a common current measuring element $Z_g$ and a corresponding current measuring path frequently exists between the star point SP of the parallel-connected load branches and the reference potential GN. This current measuring element $Z_g$ is used for measuring the mean current consumption of the consumer load as a current consumption measuring value of the current measuring signal MS, for example. The common current measuring element Z is typically used by way of a temporally smart control for performing measurements of the current consumption of the individual load branches for regulating purposes with a predefinable phasing of the measuring time with respect to the control period.

As used in this context, a current measuring means is an electrical circuit used for measuring current including, as non-limiting examples, one or more electrical components such as resistors, capacitors, inductors, coils, transistors and MOSFETs. The current measuring means can be referred to herein as a current measuring circuit.

Applications of such systems are multi-phase DC/DC converters, glow plug controls for a plurality of glow plugs or electric heating systems having a plurality of heating elements, for example.

As a rule, the current measuring path includes, besides an amplifier OP1, a low-pass filter for eliminating from the measuring signal interferences generated by the switching edges.

From DE-A-100 41 880 a method for a clocked operation of at least two electric consumer loads in accordance with a time schedule is known. From EP-A-0 198 222 a load distribution method for electric consumer loads is known.

From DE-A-10 2020 033 633 switching-on control methods and a switching-on control apparatus are known.

A technical teaching for determining, analyzing and/or diagnosing faults is not described in any of these publications.

SUMMARY

It is an object of the disclosure to provide a simplified apparatus for analyzing currents in the load branches of a multi-phase electric consumer load.

According to the disclosure, this object is achieved with an apparatus for analyzing currents in an electric consumer load, comprising
  a parallel circuit made up of a plurality of load branches,
   wherein each load branch comprises an electric load and a controllable switching element for optionally switching said load on and off, and
  a control unit for generating control signals for the switching elements.
wherein the apparatus comprises
  a current measuring means connectable in series with the parallel circuit of the load branches of the consumer load for measuring a current flowing through the parallel circuit.
  a detector for detecting a change of the current during switching-on or off or due to switching-on or switching off of the switching element of a load branch, and
  an analysis unit connected to the control unit and the detector and analyzing
   the time correlation of a control signal for switching-on or for switching-off of a switching element of a load branch with the detection of the change of the current due to switching-on and/or switching-off of the respective switching element,
  and/or
   the change of the current at several points of time of switching-on and/or switching-off of a respective switching element of a load branch or the switching elements of a plurality of, and in particular all load branches.

The apparatus according to the disclosure comprises a common current measuring means for a plurality of load branches of the parallel circuit of a multi-phase electric consumer load, with the aid of which current measuring means the current flowing through the parallel circuit can be measured. In doing so, the load branches are cyclically switched on and off, wherein, generally, changes of the total current occur which are detectable by a detector. An analysis unit receives information from the control unit which generates the switching-on and switching-off signals for the switching elements of the load branches, and from the detector. On the basis of the time correlation of switching-on and off of one or a plurality of switching elements with the detection of a change of the total current it can be examined whether the electric consumer load operates properly or is faulty. These examinations can alternatively or additionally be performed by analyzing the type of change of the current at several points of time of switching-on or switching-off of a switching element or a plurality of switching elements of the consumer load.

A change of the time correlation between switching-on of a load branch (or switching-off of the same) and the occurrence of the change of the current as detected by the detector can supply information about a change of the operation or the state of the electric consumer load. For example, on the basis of such an examination aging of components of the electric consumer load or mechanical wear of the electric consumer load or an actuator driven by the latter can be determined. The change of the total current during switching-on and/or off of a load branch should follow a specific signal curve pattern. If deviations from this pattern occur, this also indicates a change in the electric consumer load.

For example, it is advantageous when the analysis unit analyzes the type of change of the current in terms of the time course of the change and/or a change of the time correlation of a control signal for switching-on or for switching-off of a switching element of a load branch with the detection of the change of the current due to switching-on and/or switching-off of the respective switching element. The examinations of a plurality of parameters describing the time correlation and/or the change of the signal curve of the current to be carried out in this connection are many and varied and in particular dependent on the application. Carrying out all these examinations with "artificial intelligence" also allows for novel changes to be taken into account.

According to another variant of the disclosure, the analysis unit can also analyze the mathematical derivation of first order and/or second order and/or higher order of the change of the current and/or the integral across the change of the current and/or the magnitude and the direction of the change of the current, for example.

It is advantageous when the analysis is carried out with the aid of the devices of the "artificial intelligence" currently known and to be developed in the future. In such an example, the analysis unit comprises a data processing unit which, on the basis of a data base in which data are saved informing about which events concerning the operation of the electric consumer load are to be respectively associated with various results of the analysis performed by the analysis unit, produces and/or signals, like statistical models, in particular an HMM model or an artificial neural network model, control signals for the switching elements of the load branches of the electric consumer load or for its control unit when an analysis carried out by the analysis unit indicates a potential or real fault in the electric consumer load.

Another variant of the disclosure refers to a configuration of the current measuring means which should be as simple and inexpensive as possible. When the current measuring means comprises a measuring inductivity, or when in addition to the current measuring means a measuring inductivity connected in parallel to the current measuring means is provided, the detector can detect a change of the current as an interference pulse above or at or due to the measuring inductivity with its polarity being taken into account.

According to this variant of the disclosure, an apparatus for analyzing currents in an electric consumer load serves for achieving the object stated above, said apparatus comprising
  a parallel circuit made up of a plurality of load branches, wherein each load branch comprises an electric load and a controllable switching element configured for optionally switching said load on and off, and
  a control unit for generating control signals for the switching elements,
wherein the apparatus comprises
  a measuring inductivity connectable in series with the parallel circuit of the load branches of the consumer load,
  a detector for detecting the magnitude and the polarity of an interference pulse across the measuring inductivity occurring when a load branch is switched on or off, and
  an analysis unit connected to the control unit and the detector and analyzing the time correlation of a control signal for switching-on or for switching-off of a switching element of a load branch with the detection of an interference pulse across or at or due to the measuring inductivity as well as its polarity.

In the disclosure, a complex measuring impedance with an ohmic, mostly parasitic and capacitive and/or inductive portion is used which is connected between the series connection of the load branches of the electric consumer load and either the supply voltage or a reference voltage (mass, for example). Typically, in this area a current measuring means in particular configured as a shunt resistor is located.

The measuring impedance used according to the disclosure preferably comprises a measuring inductivity which causes interference pulses to be produced at the measuring inductivity when one of the load branches is switched on without another load branch being switched off at the same time. Thus, if the voltage drop across the measuring inductivity is detected, a voltage drop pulse would be detected. Since the measuring impedance typically comprises a parasitic ohmic resistance portion, a corresponding voltage drop thus occurs. When a capacitive portion of the measuring impedance is used, interference pulses occur during switching-on and switching-off.

It is now possible to analyze if and how the interference pulses at the measuring inductivity are time-correlated with switching-on or switching-off signals for the switching elements of the load branches of the electric consumer load. For example, this can be done in the analysis unit of the apparatus according to the disclosure such that initiating of e.g. a switching-on signal for a switching element is followed by an interference pulse at the measuring inductivity within a predefined time window. Also, it can be examined whether the polarity of the interference pulse is as expected. With respect to the application of the measuring inductivity, the interference pulse is positive when a switching element is switched on and is negative when a switching element is switched off.

On the basis of all these examinations it can be determined whether the electric consumer load operates properly or is faulty. In the latter case, a fault message can be issued, if desired, or the operation of the electric consumer load can be completely stopped as a precautionary measure.

Alternatively, it is also possible to evaluate, depending on the analysis of the time correlation of the switching-on and off signals for the switching elements with interference pulses at the measuring inductivity, to what extent the switching-on and off signals must be time-shifted with regard to complying with specific marginal conditions, such as EMC emissions, for example. For reducing such EMC emissions, it is known to generate the switching-on signal for the switching element of a load branch at the same time as the switching-off signal of the switching element of another load branch. In such a case, ideally no interference pulses can be detected at the measuring impedance. However, if this is nevertheless the case, this indicates that the timing of the cyclically successive switching-on and off signals for the switching elements of the individual load branches is not ideal or that another effect is responsible.

According to another variant, it can thus also be provided, inter alia, that the analysis unit analyzes whether an amount of an interference pulse is larger than a predefined minimum level and/or lies within a range between a predefined minimum level and a predefined maximum level.

According to another variant, it can further be provided that the detector is configured as an edge detector for detecting the rising or the falling edge of an interference pulse across the measuring inductivity each having a predefined minimum level.

As mentioned above, a common current measuring means for all load branches is sometimes used for measuring the currents in the individual load branches of the electric consumer load, which current measuring means is then arranged in series with the parallel circuit of the load branches. This current measuring means, in turn, is connected in series with the measuring inductivity.

As also briefly mentioned above, a shunt resistor is typically used as a current measuring means, which shunt resistor comprises an inductivity as a parasitic component, wherein the parasitic inductivity of the shunt resistor constitutes the measuring inductivity. In this variant, thus the measuring inductivity of the parasitic inductively acting portion of a shunt resistor is used. However, a parasitic capacitive component of a current measuring means can be used as well for detecting interference pulses caused by switching-on and off of the switching elements of the load branches of the electric consumer load. Hence, generally, a complex impedance is used as a current measuring means, which impedance comprises, besides an ohmic portion, parasitic, capacitive and/or inductive components.

According to another variant, it can be provided that the analysis unit analyzes whether an interference pulse with a positive polarity follows the switching-on of the switching element of one of the load branches within a predefined time window and/or whether an interference pulse with a negative polarity follows the switching-off of the switching element of one of the load branches within a predefined time window.

According to another variant, the analysis unit of the apparatus according to the disclosure can comprise a diagnosis component which generates a fault message if no interference pulse with a positive polarity follows the switching-on of the switching element of one of the load branches within a predefined time window and/or if no interference pulse with a negative polarity follows the switching-off of the switching element of one of the load branches within a predefined time window.

In an electric consumer load whose control unit controls the switching elements of two respective load branches which are successively and alternately switched on and off such that switching-off of the switching element of the one load branch is performed simultaneously with switching-on of the switching element of the other load branch, the evaluation unit according to an advantageous variant of the disclosure can analyze whether no interference pulse with a positive polarity follows the switching-on of the switching element of the one load branch within a predefined time window and/or whether no interference pulse with a negative polarity follows the switching-off of the switching element of the other load branch within a predefined time window.

In case that an interference pulse with a positive polarity follows the switching-on of the switching element of one of the load branches within a predefined time window and/or an interference pulse with a negative polarity follows the switching-off of the switching element of one of the load branches within a predefined time window, in another variant of the disclosure the analysis unit controls the switching element control unit such that it performs a time shifting of the control signals for the purpose of a simultaneous, alternate switching-on and off as well as switching-off and on of the switching elements of the respective two load branches of the electric consumer load.

According to another variant, the switching-on control signal of the control unit for switching on the switching element of a load branch can comprise a rising switching edge and the switching-off control signal of the control unit for switching off the switching element of a load branch can comprise a falling switching edge.

The components of the apparatus according to the disclosure are typically configured as an integrated circuit and thus as an IC. Such an IC can advantageously also include the switching elements of the load branches of the electric consumer load.

According to another variant, it can be provided that the analysis unit comprises a data processing unit which, on the basis of a data base in which data are saved informing about which event is to be respectively associated with various results of the analysis of the analysis unit, produces and/or signals, like statistical models, in particular an HMM model or an artificial neural network model, control signals for the switching elements of the load branches of the electric consumer load or for its control unit when an analysis performed by the analysis unit indicates a potential or real fault in the electric consumer load. According to this variant of the disclosure, a device for data/signal analysis and/or data/signal processing as within the framework of "artificial intelligence" is used, for example. In such a data processing unit, as in the case of "artificial intelligence", data analyses are carried out in a known manner on the basis of comparably huge data quantities which have been fed into neural networks during training and learning phases, for example, and which have been obtained by experiments prior to the use of the apparatus for analyzing currently determined analysis results, for example. Thus, within the framework of the disclosure, the term "data processing unit" includes all known and future devices for data/signal analyses and data/signal processing which perform what is meant and/or will be meant in the future, in the narrower and/or broader sense, by "artificial intelligence".

Finally, for achieving the aforementioned object, the disclosure provides an electric consumer load comprising
  a parallel circuit made up of a plurality of load branches, wherein each load branch comprises an electric load and
    a controllable switching element for optionally switching said load on and off, and
  a control unit for generating control signals for the switching elements, and additionally comprising the apparatus for analyzing currents in the load branches of the electric consumer load according to one of the above examples.

BRIEF DESCRIPTION OF THE DRAWINGS

Hereunder various examples are described with reference to the drawings in which.

DESCRIPTION

Figure 2:
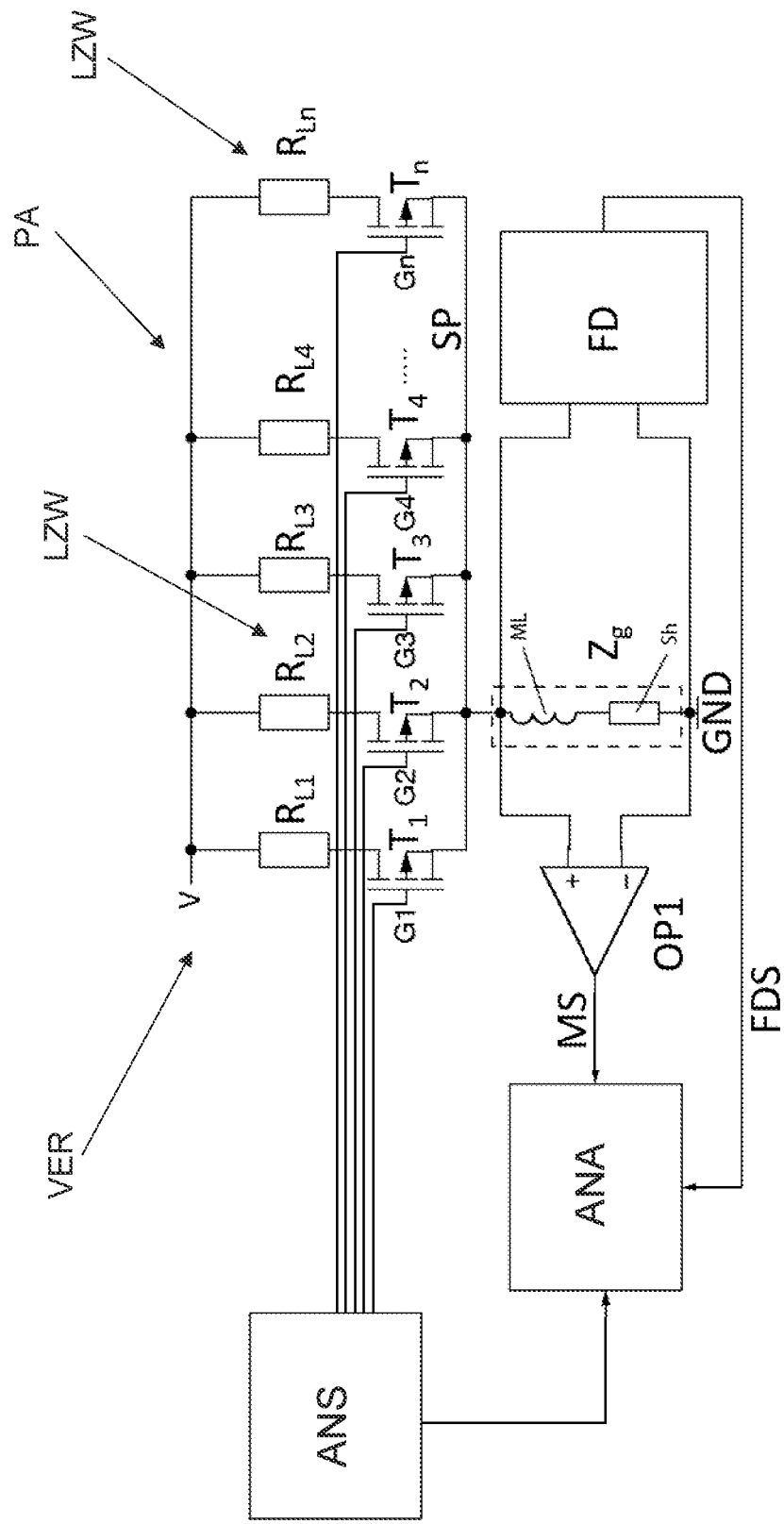
FIG. 2 shows a first example of an apparatus according to the disclosure for analyzing the currents in the load branches.

FIG. 2 shows a first example of an apparatus according to the disclosure for analyzing the respective current consumption of a multi-phase electric consumer load VER. The consumer load VER comprises a parallel circuit PA made up of a plurality of load branches LZW, wherein each load branch LZW comprises an electric load RL1, RL2, RL3, RL4, . . . , RLn and a switching element T1, T2, T3, T4, . . . Tn. The star point SP of all load branches LZW has connected thereto a current measuring means $Z_g$ which, in turn, is connected to the reference potential GND. The parallel connection PA is connected to the electric supply unit V.

The current measuring signal of the current measuring means $Z_g$ can be a measuring signal MS amplified by an amplifier OP1, for example, which measuring signal is fed to an analysis unit ANA. In addition, a detector FD is provided which detects the voltage drop across the current measuring means Z or the current, and in particular responds to changes in the current or the voltage drop. The detector signal FDS supplied by the detector FD is also fed to the analysis unit ANA.

The analysis unit ANA additionally receives a signal from the control unit ANS for the switching elements T1, T2, T3, T4, . . . , Tn, which indicates when a (possibly which) switching element is switched on or switched off.

In the analysis unit ANA various examinations can be carried out which serve for the analysis or diagnosis of the consumer load VER. Here, the time correlation of the control of one of the switching elements T1, T2, T3, T4, . . . , Tn with the appearance of the detector signal FDS is relevant. In addition, the shape (time course) of the detector signal FDS can be used in the examinations. Both the time correlation and the detection signal curve should lie within respective tolerances such that the proper operation of the consumer load VER but also a fault can be diagnosed, for example.

Figure 3:
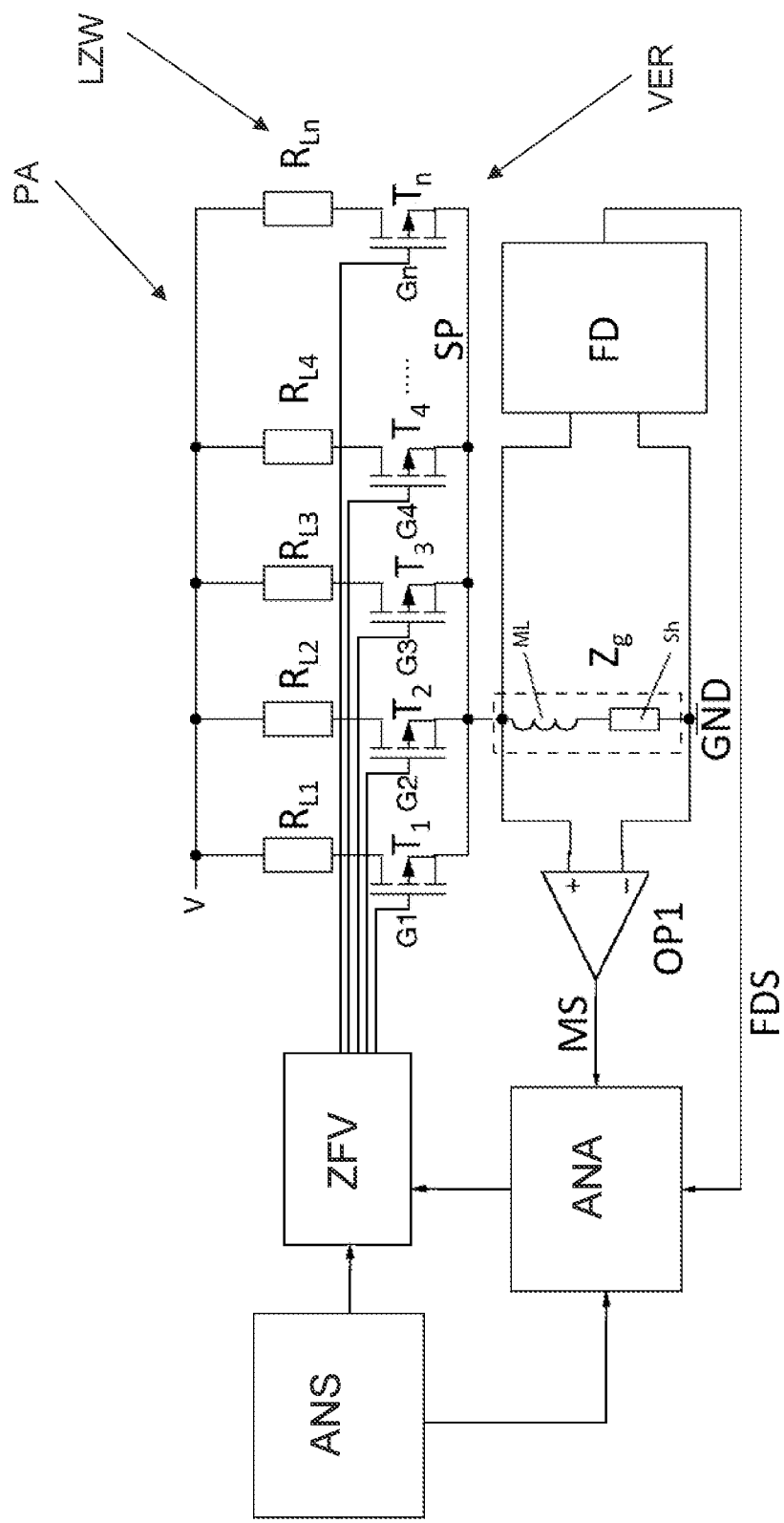
FIG. 3 shows a second example of an apparatus according to the disclosure for analyzing the currents in the load branches.

The apparatus in FIG. 2 can be enhanced, as shown in FIG. 3, in that the analysis in the analysis unit ANA influences the points of time of switching on and/or off the individual switching elements. This can be required due to manufacturing tolerances or aging processes of the electric consumer load. Also, with a view to reducing EMC emissions, time-shifting of the switching-on and off signals for the individual switching elements can be advantageous. With regard to reducing EMC emissions, the switching-off signal for the switching element of one of the load branches LZW coincides with the switching-on signal for the switching element of another load branch LZW. Then the detector FD should not detect any abnormalities, in particular no changes in the current profile. If it detects such abnormalities or changes, this indicates that the aforementioned switching-on and off signals do not coincide. The apparatus ZFV for time shifting these signals can thus bring about an optimization or "improvement". The apparatus ZVF for time shifting receives the control signals from the control unit and subjects them to a time shifting relative to each other depending on the signals obtained from the analysis unit ANA.

Hereunder further variants of the disclosure are described with reference to other figures of the drawing.

According to a particular variant, the disclosure especially deals with two objects which are frequently encountered in prior art.

First, an examination is to be performed as to whether the switching elements T1 to Tn or the transistors actually switch all n load branches of the n loads RL1 to RLn. Such a diagnosis is often required for safety purposes. It allows for a detection whether a load, for example a heating element, is highly resistive or a switching element does no longer switch. If such a detection is not carried out, subsequent damage can occur which, due to an inadequate protection in the case of a fault, may cost people their lives.

Second, an analysis of the switching-on and off times of the individual load branches is destined to lead to a minimization of the interference radiation of the electric consumer load during operation. The switching of the individual loads at staggered intervals leads to a reduction of the interference radiation, in particular the line-borne interferences, initially in the low-frequency range which is typically interpreted as a frequency range with frequencies of <1 MHz. The reduction of higher-frequency interferences in the frequency range of >1 MHz can be affected in that production tolerances e.g. in the threshold voltage of the switching elements T1 to Tn, but also in the control branches in the form of control signals G1 to Gn slightly deviating from the ideal shape can result in the individual load branches showing a different behavior with respect to each other on the one hand, and a different behavior for the switching-on and switching-off edges on the other hand.

The n switching elements T1 to Tn, the switching signal generating unit CTR, the common current measuring means $Z_g$ for all n load branches, the current measuring electronic system e.g. having an amplifier OP1 and typically further components are preferably monolithically integrated in an integrated circuit IC.

These two objects are to be achieved with as few discrete component elements as possible outside the integrated circuit in order to improve the system cost position.

Figure 4:
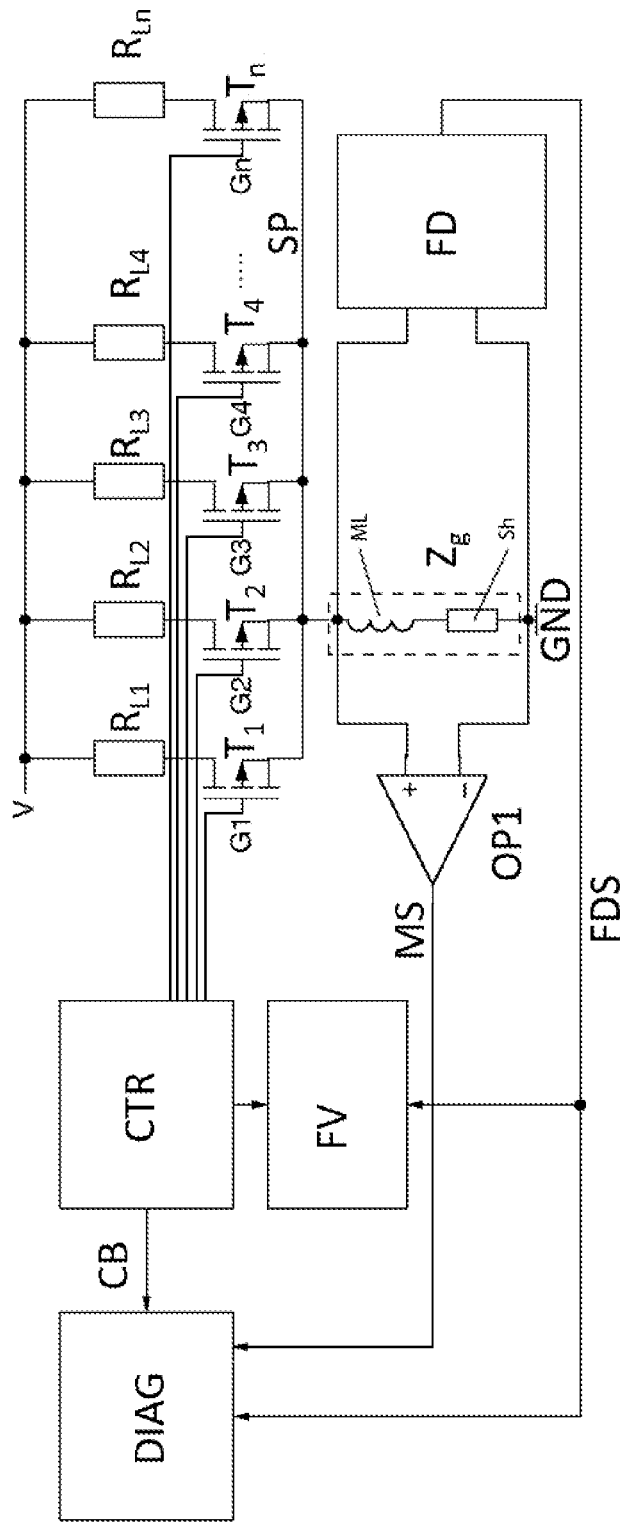
FIG. 4 shows another example of an apparatus according to the disclosure for analyzing the currents in the load branches, FIG. 5 schematically shows the setup of a contactless current measuring means which can be used as an alternative to the shunt resistors of the current measuring means of the examples in FIGS. 2 to 4.

The two aforementioned objects are achieved by using a structure shown in FIG. 4.

Figure 1:
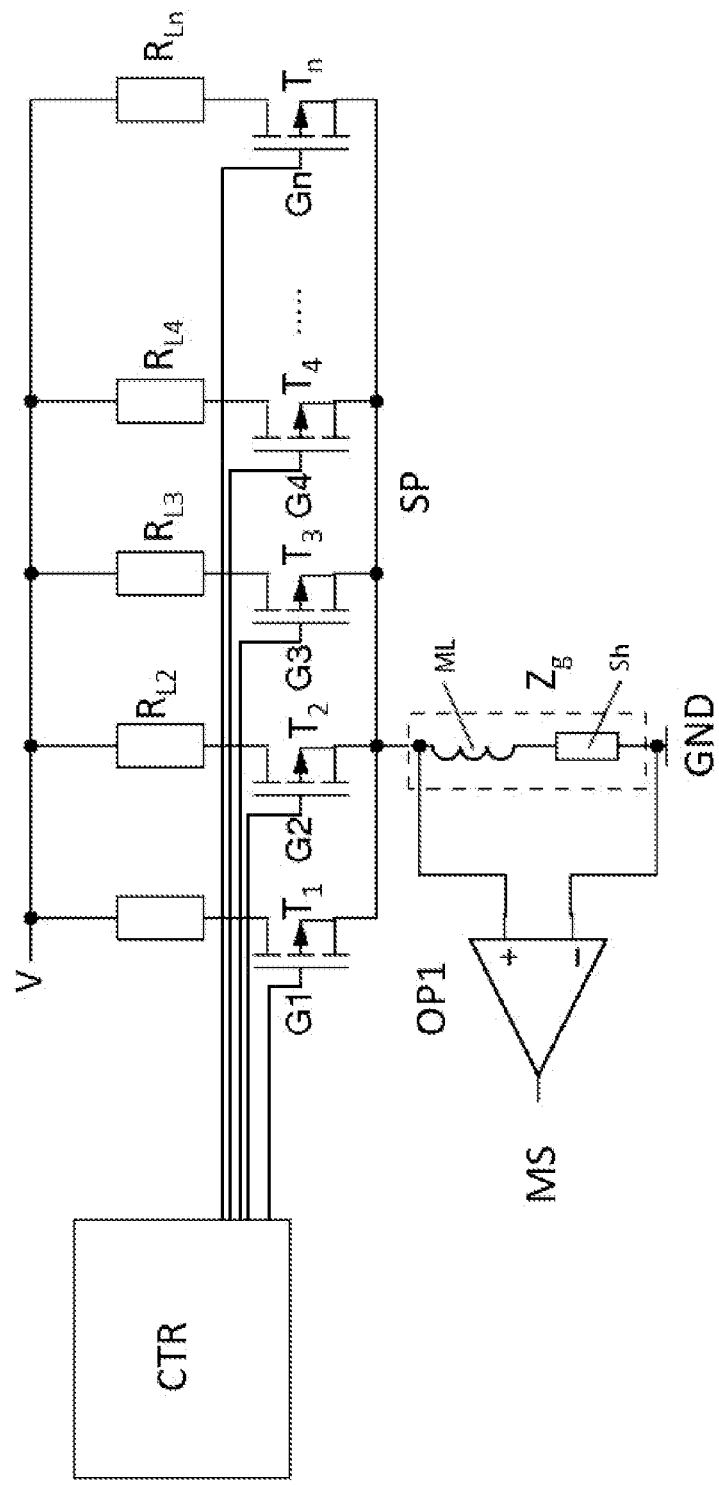
FIG. 1 schematically shows the essential elements for controlling an electric consumer load having a plurality of load branches which are connected in parallel and with which a common current measuring means is associated.

Here, the fact is utilized that the common current measuring means typically contains a parasitic and thus mostly undesired inductivity. This is shown in FIGS. 1 and 4 by way of example as an inductivity ML forming part of the current measuring means $Z_g$. Preferably, the current measuring means $Z_g$ is an ohmic resistor, i.e. a so-called shunt resistor. In the case of typical shunt resistors Sh used as current measuring means $Z_g$ this inductivity ML mostly has a value ranging between 5 nH and 10 nH.

In the application circuit the parasitic inductivity ML of the current measuring means $Z_g$ has the undesired effect that at each switching edge of one of the n switching elements T1 to Tn a short but relatively strong pulsed interference of the current measuring signal MS occurs, which signal preferably describes the voltage drop across the current measuring means $Z_g$. The polarity of this interference depends on whether during the switching edge the current through the current measuring means $Z_g$ is increased (i.e. the interference is a positive current pulse) or reduced (i.e. the interference is a negative current pulse).

In addition to prior art shown in FIG. 1, the disclosure provides an edge detector FD. This edge detector FD detects the point of time when the interference occurs at the current measuring means $Z_g$ and thus in the current measuring signal MS. According to another example, the edge detector FD can also detect the polarity of the interference at the current measuring means $Z_g$ and thus in the current measuring signal MS. For example, the polarity of the interference can be evaluated by the edge detector FD as "no interference", "positive interference" or "negative interference". An edge detector FD is required in all examples of the disclosure. Here, it is irrelevant whether the apparatus is to be used for diagnosing purposes, for reducing the interference radiation or both.

The edge detector FD can be located directly at the current measuring means $Z_g$ and evaluate the voltage drop across the current measuring means $Z_g$, for example. The edge detector FD can also be located at the output for the current measuring signal MS and evaluate the latter, for example. The latter case is, however, reasonable only when the current measuring path with the amplifier OP1 and a possibly existing low-pass filter for the current measuring signal MS has very rapid reaction times of usually <1 µs and the low-pass filter is not present, which would be detrimental to other regulation purposes.

The following description of examples is divided according to which of the aforementioned two exemplary purposes the respective application is to serve. However, an application where the two purposes are combined is also possible.

Diagnosis

For this purpose, a diagnosis block DIAG is connected to the switching signal generating unit CTR and the edge detector FD. The diagnosis block DIAG has the following functionality:

The switching signal generating unit CTR generates switching events for the n switching elements T1 to Tn with the aid of the n control signals G1 to Gn. The switching signal generating unit CTR now signals to the diagnosis block DIAG each one of these switching events e.g. via a pulse or e.g. an alternating signal. The diagnosis block DIAG then starts an activation interval for a specific first-time duration. If the edge detector FD detects an interference pulse within this first-time duration, the load branch is actually switched. If the switching signal generating unit CTR has switched only a single switching element of the n switching elements T1 to Tn controlled in the time division multiplex, this switching element and the respective load branch are present and switching. The diagnosis block DIAG can therefore evaluate this load branch as "in order" at least from this functional point of view. If the edge detector FD has not detected an edge by the end of the first-time duration, the switching element of the corresponding load branch has not switched, or the load branch is interrupted. Therefore, the diagnosis block DIAG typically evaluates this load branch as "faulty" at least from this functional point of view, wherein the diagnosis block typically does not differentiate whether the fault actually is in the edge detector FD or in the respective load branch since this is typically of no importance for the safety-relevant evaluation. For many applications this first-time duration lies in a time duration range which is smaller than 2 µs. However, there are exceptions for special applications (e.g. glow plug control) where the switching edges are considerably more inert and, consequently, the first time duration can be considerably increased. In such cases, the first time duration can e.g. be 100 µs and more.

For plausibility tests or for furnishing more details, the polarity of the switching interference pulse can be taken into account in the evaluation if the edge detector FD detects the polarity.

In response to a switching-on signal of the switching signal generating unit CTR for one of the n switching elements T1 to Tn the edge detector FD must detect a positive interference pulse during the first time duration and transmit it to the diagnosis block DIAG e.g. via an edge detection signal FDS.

In response to a switching-off signal for one of the n switching elements T1 to Tn the edge detector FD must detect a negative interference pulse during the first time duration or generally a predefined time duration and transmit it to the diagnosis block e.g. via the edge detection signal FDS.

Thus, it is possible to reliably detect faulty conditions and possibly perform an emergency shut-off of the system via a safety switch which can be arranged in series with the supply unit V or the reference potential GND.

Reduction of the Interference Radiation (EME)

For this purpose, a switching edge shifting block FV for time-shifting the switching edge, i.e. the switching-on and switching-off control signals for the switching elements, is connected upstream or downstream of the switching signal generating unit CTR.

The following description refers to the case where the edge shifting block FV is connected downstream of the signal generating unit CTR (see FIG. 4). The outputs of the analysis unit FV then generate at least part of the n control signals G1 to Gn for controlling the corresponding switching elements T1 to Tn. Here, two possible applications are presented:

1) Measurement of and Compensation for the Delay Times

Here, the edge shifting block FV measures, preferably for each individual load branch and preferably each rising or falling switching edge for the switching element of the respective load branch, a first delay time between the switching-on control signal of the switching signal generating unit CTR for the respective switching element and the arrival of the corresponding interference pulse at the current measuring means $Z_g$, detected by the edge detector FD. The edge shifting block FV then uses the measured first delay time for shifting the control signals G1 to Gn relative to each other such that a rising switching edge for the switching element of a load branch always coincides with a falling switching edge for the switching element of another load branch and vice versa.

Preferably, the edge shifting block FV can determine this shifting with the aid of a statistic signal model, for example a neural network model.

The edge shifting block FV can include an evaluator which improves the parameters of such a neural network model during operation. Here, the evaluator enhances the parameters for such decisions which improve, that is reduce, the respective condition, for example the interferences. Here, the evaluator mitigates the parameters of such decisions of the neural network which have deteriorated, that is increased, the respective condition, for example the interferences. For this purpose, the evaluator checks the values of the edge detector signal FDS before and after the change with the aid of the neural network.

For avoiding a safety-relevant faulty training, it is reasonable to provide a safety evaluator which recognizes and suppresses obviously faulty shifts by the edge shifting block FV or, in all probability, future faulty shifts of the edge shifting block FV and correspondingly retrains the neural network. For example, the amounts of shifts can be suppressed beyond specific time values. If the edge shifting block FV nevertheless tries to carry out such shifting, the neural network is faulty and the safety evaluator prevents the edge shifting block FV from performing this time shifting beyond the time target range and retrains the neural network. Regarding the training of neural network models, please refer to the literature concerning prior art neural network models.

As described above, the edge shifting block FV subsequently utilizes the measured first delay time for shifting the control signals G1 to Gn relative to each other such that an actual rising switching edge for the switching element of a load branch always coincides with a falling switching edge of another load branch and vice versa. For this purpose, e.g. the longest measured first delay time is utilized, and the switching edges around the longest measured first delay time—delay time of the corresponding edge of the corresponding load branch—are shifted. Instead of the longest measured first delay time a constant time can also be utilized which without fail at least corresponds to the largest measured first delay.

2) Minimization of the Duration of Interferences

As long as a switching-off edge of a load branch does not exactly coincide with a switching-on edge of another load branch the edge detector FD observes at least two edges (interference pulses). Since the switching-on edges themselves are not temporally infinitely short, a short-period interference signal may occur at the edge detector FD, which interference signal has more than only two edges.

The edge shifting block FV measures a second time duration of the interference and changes the shifting of the switching edges of the control signals G1 to Gn with a view to either minimize the second time duration of the interference or to reduce its amount (in the mathematical sense) to a specific value below a first threshold value.

Here, the direction (leading or lagging) in which the switching edges must be shifted is relatively easy to determine on the basis of the polarity of the edge of the interference measured by the edge detector. If the first occurring interference edge is a negative edge the switching-off edge for the switching element, i.e. for the switching element of the one load branch, temporally occurred before the switching-on edge of the other switching element. The edge shifting block FV must thus increase the delay of the switching-off edge or reduce the delay of the switching-on edge. If the first occurring edge is a positive edge the switching-on edge occurred before the switching-off edge. In this reverse case, the edge shifting block FV must thus reduce the delay of the switching-off edge or increase the delay of the switching-on edge. When the regulation target is achieved and the switching-on edge and the switching-off edge are exactly symmetrical relative to each other with respect to the measuring result of the edge detector FD, for example, the case occurs that the edge detector does no longer detect an edge. Then, within the framework of the regulation, the edge shifting block need not change the temporal interventions. As soon as the regulation target is no longer achieved due to changes in the ambient conditions, for example, the edge detector FD again detects interference edges, and the regulation by the edge shifting block FV can be continued.

Combination of Diagnosis and Interference Radiation Reduction

For this third purpose, the analysis unit can comprise both the edge shifting and the diagnosis functionality (FIG. 4) and combine their functions.

For diagnosis purposes, corresponding refinements can be carried out. If the rising and falling edges cancel each other and the edge detector FD thus no longer detects any edges, the diagnosis block DIAG can assume that either both edges have occurred or both respective load branches are in order.

However, if both load branches are defective, in the case of more than two load branches an interference edge would be detected at another point of time, which can no longer be corrected by the edge shifting block FV. It is therefore reasonable when the diagnosis block DIAG determines and evaluates the successful temporal edge shifting of the edge shifting block FV during a subsequent period. For this purpose, the edge shifting block FV preferably furnishes the diagnosis block DIAG with corresponding information about such an edge shifting. Alternatively, this diagnosis can, of course, also be carried out by the edge shifting block FV itself.

In the case of a non-ideal cancellation of the edges it can always be observed on the basis of the interference itself whether both load branches concerned have actually been switched. For this purpose, the interference detected by the edge detector FD must contain at least one rising and one falling interference edge (positive and negative interference pulses).

Examples of the Current Measuring Means

The examples of the current measuring means stated here serve as non-limiting examples. They illustrate the state of the art and show their suitable utilization within the framework of this disclosure. Other examples are possible. A possible enhancement is also illustrated.

1) Shunt Resistor

The use of a shunt resistor is normally the most inexpensive variant for current measurement. It is illustrated in FIG. 1. The shunt resistor entails a parasitic inductivity. The utilization of this inductivity as a measuring inductivity ML has been described above.

2) Contactless Current Measurement

Figure 5:
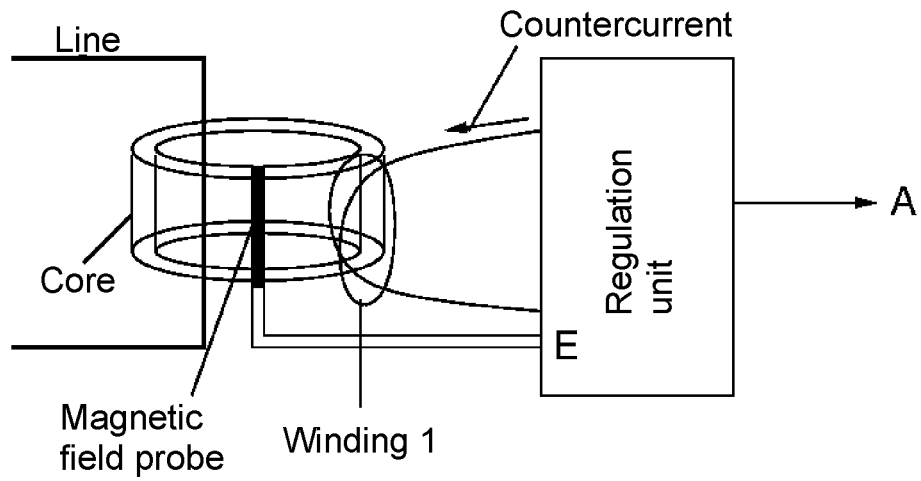

FIG. 5 show a prior art contactless current sensor. The line where the current is to be measured extends through a core, for example a ferrite core. The core serves for focusing the magnetic flux density B. Provision of the core is not absolutely necessary but is normally advantageous. However, the function can be performed without a core. But the core offers advantages with regard to the measuring sensitivity.

In the core (e.g. in a gap of the core) a measuring probe for measuring the magnetic field strength H or flux density B is located. Mostly, this is a holding element. A first winding 1 is arranged on the core for generating an opposing field to that magnetic field generated by the current-carrying line to be measured. A regulation unit measures the output signal of the magnetic field probe at an input E and generates a countercurrent in the first winding 1 with a view to regulating the magnetic field strength H or the magnetic flux density B in the core to a value of zero. The value of the countercurrent is then a measure of the electric current flowing in the line. At another output A the value of the countercurrent is made available either as a current or converted into a voltage preferably multiplied by a proportionality factor. Thus, the output A supplies the current measuring signal MS.

Due to the inertia of the regulation such an assembly is mostly not suitable for allowing an edge to be detected at output A as is necessary for the application of this invention. However, its setup contributes to considerably increasing the inductivity of the line extending through the core.

The signal on the basis of which the edges are to be detected can thus be readily tapped at the terminals of the line itself, however, the consequence being that the edge detection is again galvanically connected to the line.

Figure 6:
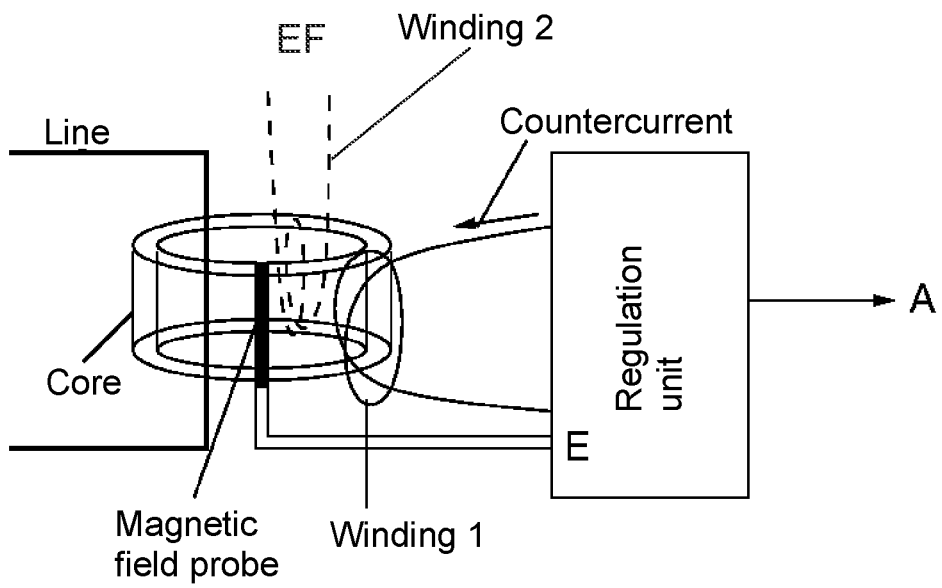
FIG. 6 shows an alternative example of a contactlessly operating current measuring means.

However, if it is required that the edge detection itself is to be carried out galvanically separated from the current path, either the voltage at the first winding 1 can directly be tapped as a measuring signal for the edge detector FD (the regulation only influences the current and is independent of the voltage) or the enhancement shown in FIG. 6 can be realized. For this purpose, another winding 2 is applied to the core, whose terminals directly lead to the edge detector FD.

Of course, the further winding 2 can also be applied to another core which is independent of the current measuring means and through which the (measuring) line is laid. The further winding 2 can also be configured as an air coil and be placed in a suitable location relative to the measuring line. It can form part of a conductor of a printed circuit board, for example.

Edge Detector

Figure 7:
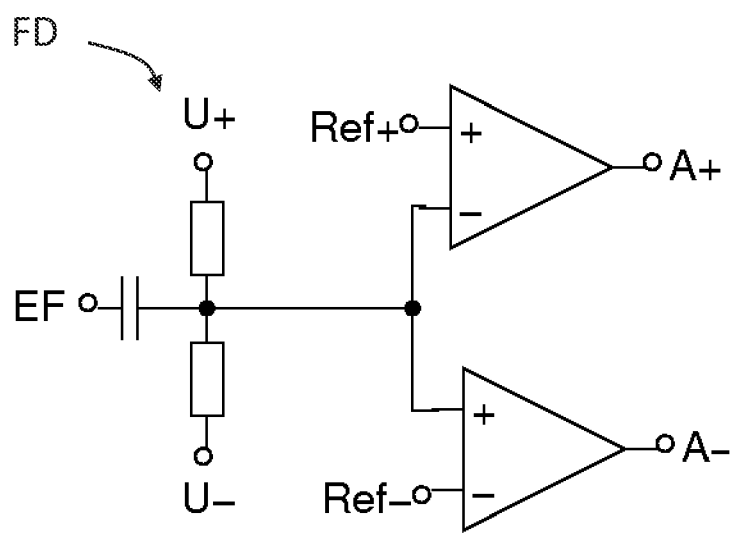
FIG. 7 shows a circuit for realizing an edge detector which can be used for determining the interference pulses at the measuring inductivity.

According to prior art, the edge detector FD can relatively easily be configured with a high-pass filter and comparators CMP1, CMP2, for example. FIG. 7 shows such a simple edge detector FD. The high-pass filter is constituted by the capacitor C and the resistance divider R1, R2. The resistance divider R1, R2 simultaneously sets the idle state of the input signals DEF for the two comparators CMP1, CMP2. Their reference signals Ref+, Ref− each have suitable values above and below the idle state. In the case of a rising edge at the input EF of the edge detector FD the output signal A+ becomes active for the rising edge for a short period. In the case of a negative edge at the input EF of the edge detector FD the output signal A− becomes active for the falling edge for a short period. Preferably, the diagnosis block DIAG is connected to the output signal A− for the falling edge and the output signal A+ for the rising edge. The output signal A− for the falling edge and the output signal A+ for the rising edge together constitute the edge detector signal FDS in this example.

If the edge detector FD is to be utilized only for diagnosis purposes and not for EME optimization (optimization of the radiation behavior) it may be sufficient to provide only one of the two comparators CMP1, CMP2 and then only one of the two switching edges is treated in the diagnosis block DIAG.

Features of the Apparatus and/or of its Variants

Although various versions are described hereunder according to which the disclosure can be embodied, individual features of various versions can be combined, if necessary.

The disclosure according to a first version refers to an apparatus for switched control of a plurality of loads RL1 to RLn having switching elements T1 to Tn, a switching signal generating unit CTR, a common current measuring means $Z_g$, an edge detector FD, a star point SP, an edge detector signal FDS and control signals G1 to Gn. The switching elements T1 to Tn are configured and provided for respectively connecting one or a plurality of loads RL1 to RLn to a supply unit V and/or the star point SP or disconnecting them. The current measuring element $Z_g$ is connected between the star point SP and the reference potential GND. The switching signal generating unit CTR controls the switching elements T1 to Tn with the control signals G1 to Gn. The current measuring element $Z_g$ detects the current between the star point SP and the reference potential GND and generates a current measuring value signal. The edge detector FD evaluates the current measuring value signal and possibly detects the presence of an edge. It signals the presence of an edge of the current measuring value signal via the edge detector signal FDS. The edge detector signal FDS can influence the switching times of the switching elements T1 to Tn. The edge detector signal FDS may also be used parallel or alternatively to the fault condition detection.

According to a first variant, the apparatus comprises a first time measuring device. The first time measuring device measures a first time duration from the change of state of at least one generated control signal at a first point of time to the beginning of a signaling via the edge detector signal FDS and preferably generates a measuring value for this first time duration.

According to a second variant, the edge detector signal FDS at least temporarily comprises the information about the direction of a detected edge.

According to a third variant, the apparatus comprises a second time measuring device which can be identical with or similar to the first time measuring device. The second time measuring device measures the second time duration of the presence of an interference signal measured at the edge detector FD. Within the meaning of this disclosure, an interference signal is a sequence of rising and falling edges within a first predefined time interval.

According to a fourth variant, the apparatus comprises a time window generator. The time window generator generates a second predefined time interval when a specific switching signal event occurs in the switching signal generating unit CTR or in the case of a specific delay to this switching signal event. Typically, this is a signal which assumes a special state for this time interval.

According to a fifth variant, the apparatus comprises a third time measuring device which can be identical with the first and/or the second time measuring device. In this refined variant, the current measuring element comprises an additional output which is reflective of the current flowing through the current measuring element. The edge detector FD evaluates the signal of this additional output. The third time measuring device measures the third time duration from the beginning of the change of state of at least one generated control signal to the beginning of the edge detected at the edge detector FD and generates a respective measuring value.

According to a sixth variant, the detected direction of the edge is taken into account in the measurement of the third time duration. Thus, not all edges are used in this refined variant at all times.

According to a seventh variant, the apparatus comprises a fourth time measuring device which can be identical with or similar to the first time measuring device and/or the second time measuring device and/or the third time measuring device. In this refined variant, too, the current measuring element comprises an additional output which is reflective of the current flowing through the current measuring element.

The edge detector FD evaluates the signal of this additional output. The fourth time measuring device measures the second time duration of the presence of an interference signal measured at the edge detector FD and generates a corresponding measuring value. Here, an interference signal is a sequence of rising and falling edges within a first or another predefined time interval.

According to an eighth variant, the apparatus comprises a fifth time measuring device which can be identical with or similar to the first time measuring device and/or the second time measuring device and/or the third time measuring device and/or the fourth time measuring device. The current measuring means preferably includes a sub-device and/or sub-devices, in particular an inductivity or a counter-inductivity. This sub-device of the current measuring means $Z_g$ is preferably suitable and/or provided for converting a change of current in a line between the star point SP and the reference potential GND into a signal suitable for edge detection by the edge detector FD. The fifth time measuring device measures the fifth time duration from the beginning of the change of state of at least one generated control signal to the beginning of the edge detected at the edge detector FD and generates a corresponding measuring value.

According to a ninth variant, the direction of the edge is taken into account in the measurement of the fifth time period by the fifth time measuring device. Thus, not all edges are used in this refined variant at all times.

According to a tenth variant, the apparatus comprises a sixth time measuring device which can be identical with or similar to the first time measuring device and/or the second time measuring device and/or the third time measuring device and/or the fourth time measuring device and/or the fifth time measuring device. The current measuring means again includes a sub-device and/or sub-devices, in particular an inductivity or a counter-inductivity. This sub-device of the current measuring means $Z_g$ is preferably suitable and/or provided for converting a change of current in a line between the star point SP and the reference potential GND into a signal suitable for edge detection by the edge detector FD. The sixth time measuring device measures the sixth time duration of the presence of an interference signal measured at the edge detector FD and generates a corresponding measuring value. Here, an interference signal is again a sequence of rising and falling edges within a first or another predefined time interval.

According to an eleventh variant, the apparatus comprises a time window generator. The current measuring means again includes a sub-device and/or sub-devices, in particular an inductivity or a counter-inductivity. This sub-device of the current measuring means $Z_g$ is preferably suitable and/or provided for converting a change of current in a line between the star point SP and the reference potential GND into a signal suitable for edge detection by the edge detector FD. The time window generator generates a third predefined time interval when a specific switching signal event occurs in the switching signal generating unit CTR or in the case of a specific delay to this switching signal event.

According to a twelfth variant, the apparatus comprises an analysis unit FV. The analysis unit FV is suitable and/or provided for delaying or time-shifting, depending on at least one of the aforementioned measured time durations, the control signals G1 to Gn or their generation such that the edge detector FD does no longer detect any edges.

According to a thirteenth variant, the apparatus comprises an analysis unit FV, wherein the analysis unit FV is suitable and/or provided for delaying or time-shifting, depending on at least one of the aforementioned measured time durations, the control signals G1 to Gn or their generation such that the respective time duration is minimized or its amount does not exceed a predefined time value.

According to a fourteenth variant, the apparatus comprises an analysis unit FV, wherein the analysis unit FV is suitable and/or provided for delaying or preponing, depending on whether the first edge detected by the edge detector FD in a time interval is a positive or a negative edge, the switching-on edge or the switching-off edge of a control signal G1 to Gn and/or another change of state of a control signal G1 to Gn.

According to a fifteenth variant, the apparatus comprises a diagnosis block DIAG, wherein the diagnosis block DIAG generates or provides a fault signal if the edge detector FD does not detect an edge within a predefined time window temporally related to a time after a change of state of a control signal G1 to Gn.

According to a sixteenth variant, the apparatus comprises a diagnosis block DIAG, wherein the diagnosis block DIAG does not generate or provide a fault signal if the edge detector FD does not detect a pair of two edges temporally succeeding each other within a predefined time window temporally related to a time after a change of state of a control signal G1 to Gn.

According to a seventeenth variant, the time windows of signal pairs are cyclically exchanged for identifying multiple faults.

According to an eighteenth variant, the apparatus comprises an analysis unit FV, wherein the analysis unit FV is suitable and/or provided for delaying or preponing the switching-on edge or the switching-off edge of a control signal G1 to Gn and/or another change of state of a control signal G1 to Gn. Here, the analysis unit FV includes a neural network model or another structure which is a model of artificial intelligence and is in particular capable of performing a deep learning and/or machine learning method. According to the principles of the present disclosure, in this variant, the apparatus includes said neural network model which is preferably stored as a software model in a digital memory of the analysis unit FV, for example, and executed by a computer which preferably forms part of the apparatus. Neural network models with deep learning include software which can be written by a software designer and is available from a number of public sources. An application which can be used for configuring a neural network model with the name "NVidia Digits" is available under https://developer.nvidia.com/digits. NVidia Digits is a high-level user interface which includes a deep learning framework with the name "Caffe" developed by Berkley Vision and Learning Center (http://caffe.berkeleyvision.org/). A list of established deep learning frameworks which are suitable for use in an implementation of the present disclosure can be found at https://developer.nvidia.com/deep-learning-frameworks.

According to a nineteenth variant, the apparatus comprises a diagnosis block DIAG, wherein the diagnosis block DIAG includes a neural network model. What has been said above concerning neural networks, computers, memories, deep learning, machine learning and the training methods applies here, too.

According to a twentieth variant, the input signal of the edge detector FD is galvanically separated from the star point SP.

According to this second version, the disclosure refers to an apparatus for switched control of a plurality of loads RL1 to RLn having switching elements T1 to Tn, a switching signal generating unit CTR, control signals G1 to Gn, a measuring device and an analysis unit FV. The switching elements T1 to Tn are configured and provided for respectively connecting one or a plurality of loads RL1 to RLn to a supply unit V and/or to a star point SP or a reference potential GND or disconnecting them. The switching signal generating unit CTR controls the switching elements T1 to Tn with the control signals G1 to Gn. The measuring device acquires relevant operating condition data of the apparatus. The analysis unit FV is suitable and/or provided for delaying or preponing the switching-on edge or the switching-off edge of a control signal G1 to Gn and/or another change of state of a control signal G1 to Gn. The analysis unit FV includes a neural network model. The analysis unit FV uses acquired operating condition data as an input for the neural network.

According to a first variant of this second version, the apparatus includes an evaluation block which checks and/or changes the parameters of such a neural network model during operation.

According to a second variant of this second version, the apparatus includes a safety evaluation block which recognizes and prevents obviously faulty and possibly safety-relevant changes of the commutation before they are carried out.

According to a third variant of this second version, the safety evaluation block changes the parameters of such a neural network model during operation in the case of an attempted obviously faulty and possibly safety-relevant change of the commutation by the neural network model.

According to this third version, the disclosure refers to an apparatus for switched control of a plurality of loads RL1 to RLn having switching elements T1 to Tn, a switching signal generating unit CTR, control signals G1 to Gn, a measuring device and an analysis unit FV. The switching elements T1 to Tn are configured and provided for respectively connecting one or a plurality of loads RL1 to RLn to a supply unit V and/or to a star point SP or a reference potential GND or disconnecting them. The switching signal generating unit CTR controls the switching elements T1 to Tn with the control signals G1 to Gn. The measuring device acquires relevant operating condition data of the apparatus. The analysis unit FV is suitable and/or provided for delaying or preponing the switching-on edge or the switching-off edge of a control signal G1 to Gn and/or another change of state of a control signal G1 to Gn. The analysis unit FV includes a statistical model for calculating time sequence patterns and/or for predicting time sequences. This can be a Viterbi or HMM model, for example. The analysis unit FV uses acquired operating condition data as an input for the statistical model.

According to a first variant of this third version, the statistical model is an HMM model or a neural network model.

According to a second variant of this third version, the apparatus includes an evaluation block which checks and/or changes the parameters of such a statistical model.

According to a third variant of this third version, the apparatus includes a safety evaluation block which recognizes and prevents obviously faulty and possible safety-relevant changes of the commutation before they are carried out.

According to a fourth variant of this third version, the safety evaluation block changes the parameters of such a statistical model during operation in the case of an attempted obviously faulty and possibly safety-relevant change of the commutation by the statistical model.

A preferred detail of the apparatus presented here refers to the measuring device for the measurement of a summated current. The measuring device comprises a conductor, a first winding 1, a second winding 2, a regulation unit and a magnetic field probe. The conductor and the first winding 1 and the second winding 2 are magnetically connected to each other. In particular in the case of changes in the magnetic flux density provoked by one of them can lead to an induction taking place in the other. The conductor is provided and/or destined for being connected as a common measuring means $Z_g$ between the star point SP and the reference potential GND such that the summated current can flow through said conductor from the star point to the reference potential GND. The magnetic field probe detects the magnetic field of the current flowing through the conductor and of the windings as a magnetic field measuring value. The regulator generates, with the aid of the magnetic field measuring value, a regulated countercurrent flowing through the first winding 1 and compensates, with the aid of the first winding 1, for the magnetic field of the conductor with a first time constant. The further second winding 2 is destined and provided for being utilized as a current measuring element $Z_g$ for the edge detector FD with a second time constant. Preferably, the second time constant is smaller than the first time constant.

According to this fourth version, the disclosure relates to an apparatus for switched control of a plurality of loads RL1 to RLn with a sub-device for controlling these loads. Here, the sub-device includes a statistical model.

According to a first variant of this fourth version, the statistical model is an HMM model or a neural network model or an HMM model or a Petri net.

The fifth version refers to a corresponding method for operating an apparatus for switched control of a plurality of loads RL1 to RLn. The apparatus to be operated with the aid of the method includes switching elements T1 to Tn, a star point SP and a reference potential GND. The switching elements T1 to Tn are configured and provided for respectively connecting a plurality of loads RL1 to RLn to a supply unit V and/or the star point SP and disconnecting them. The method comprises the steps described below. A first step refers to detecting a current from the star point SP to the reference potential GND preferably with the aid of said current measuring means Zs. Then, on the basis of the thus determined detection results, the detection of edges in the current from the star point SP to the reference potential GND and the generation of respective information are carried out. Subsequently, the thus generated information is used for operating the apparatus.

This roughly outlined method can then be further refined. It is particularly preferred that said information is used for controlling the switching elements.

According to another variant of the method, the point of time of a change of state of one of the switching elements T1 to Tn depends on this information. For example, the commutation or control of a motor or a power supply or a voltage regulator or a switching power supply can be changed in this manner.

According to another variant of the method, a change of the detection time of at least one edge takes place such that the latter is no longer detectable due to an interaction with another edge. This change can be realized by shifting the point of time of the change of the state of a control signal G1 to Gn of the switching elements T1 to Tn, for example.

As described above, according to another variant, this information can be used in parallel or alternatively for recognizing a fault condition.

On the one hand, the disclosure allows for recognizing safety-relevant failures in due time. This is in particular important in the case of electromobility since here considerable amounts of energy can occur and cause considerable danger in the case of damage. In addition, the EMC radiation can be significantly improved. However, the advantages are not limited to this.

Further, the disclosure can alternatively be described by one of the feature groups stated below, wherein the feature groups can be combined in any manner and also individual features of a feature group can be combined with one or several features of one or several other feature groups and/or one or several of the aforementioned variants.

1. An apparatus for switched control of a plurality of loads RL1 to RLn,
comprising switching elements T1 to Tn, and
comprising a switching signal generating unit CTR, and
comprising a common current measuring element $Z_g$, and
comprising an edge detector FD, and
comprising a star point SP, and
comprising an edge detector signal FDS, and
comprising control signals G1 to Gn,
wherein the switching elements T1 to Tn are configured and provided for respectively connecting one or a plurality of loads RL1 to RLn to a supply unit V and/or the star point SP and disconnecting them, and
wherein the current measuring element $Z_g$ is connected between the star point SP and the reference potential GND, and
wherein the switching signal generating unit CTR controls the switching elements T1 to Tn with the control signals G1 to Gn, and
wherein the current measuring element $Z_g$ detects the current between the star point SP and the reference potential GND and generates a current measuring value signal, and
wherein the edge detector FD evaluates the current measuring value signal, possibly detects the presence of an edge, and signals the presence of an edge on the current measuring value signal via the edge detector signal FDS, and
wherein the edge detector signal FDS can influence the switching times of the switching elements T1 to Tn and/or is used for fault condition detection.

2. The apparatus according to item 1, comprising a first time measuring device, wherein the first time measuring device measures a first time duration from the change of state of at least one generated control signal at a first point of time up to the beginning of a signaling via the edge detector signal FDS.

3. The apparatus according to item 1 or 2, wherein the edge detector signal FDS at least temporarily also includes information about a direction of a detected edge.

4. The apparatus according to one or several of the preceding items 1 to 3,
comprising a second time measuring device,
wherein the second time measuring device measures the second time duration of the presence of an interference signal measured at the edge detector FD.
wherein an interference signal is a sequence of rising and falling edges within a first predefined time interval.

5. The apparatus according one or several of the preceding items 1 to 4,
comprising a time window generator,
wherein the time window generator generates a second predefined time interval when a specific switching signal event occurs in the switching signal generating unit CTR or with a specific delay to this switching signal event.

6. The apparatus according to one or several of the preceding items 1 to 5,
comprising a third time measuring device.
wherein the current measuring element comprises an additional output which is reflective of the current through the current measuring element, and
wherein the edge detector FD evaluates the signal of this additional output, and
wherein the third time measuring device measures the third time duration from the beginning of the change of state of at least one generated control signal to the beginning of the edge detected at the edge detector FD.

7. The apparatus according to item 6,
wherein the detected direction of the edge is taken into account for the measurement of the third time duration.

8. The apparatus according to one or several of the preceding items 1 to 7,
comprising a fourth time measuring device,
wherein the current measuring element comprises an additional output which is reflective of the current through the current measuring element, and
wherein the edge detector FD evaluates the signal of this additional output, and
wherein the fourth time measuring device measures a fourth time duration of the presence of an interference signal measured at the edge detector FD,
wherein an interference signal is a sequence of rising and falling edges within a first or another predefined time interval.

9. The apparatus according to one or several of the preceding items 1 to 8,
comprising a fifth time measuring device.
wherein the current measuring device includes a sub-device and/or sub-devices, in particular an inductivity or a counter-inductivity, and
wherein this sub-device or one of the sub-devices of the current measuring means $Z_g$ is suitable and/or provided for converting a change of current in a line between the star point SP and the reference potential GND into a signal suitable for edge detection by the edge detector FD, and
wherein the fifth time measuring device measures a fifth time duration from the beginning of the change of state of at least one generated control signal to the beginning of the edge detected at the edge detector FD.

10. The apparatus according to item 9,
wherein the fifth time measuring device takes into account the direction of the edge for the measurement of the fifth time duration.

11. The apparatus according to one or several of the preceding items 1 to 10,
comprising a sixth time measuring device.
wherein the current measuring means includes a sub-device and/or sub-devices, in particular an inductivity or a counter-inductivity, and
wherein this sub-device of the current measuring means $Z_g$ is suitable and/or provided for converting a change of current in a line between the star point SP and the reference potential GND into a signal suitable for edge detection by the edge detector FD, and
wherein the sixth time measuring device measures a sixth time duration of the presence of an interference signal measured at the edge detector FD, and
wherein an interference signal is a sequence of rising and falling edges within a first or another time interval.

12. The apparatus according to one or several of the preceding items 1 to 11, comprising a time window generator.
wherein the current measuring means comprises a sub-device and/or sub-devices, in particular an inductivity or a counter-inductivity, and
wherein this sub-device or one of the sub-devices of the current measuring means $Z_g$ is suitable and/or provided for converting a change of current in a line between the star point SP and the reference potential GND into a signal suitable for edge detection by the edge detector FD, and
wherein the time window generator generates a third predefined time interval when a specific switching signal event occurs in the switching signal generating unit CTR or with a specific delay to this switching signal event.

13. The apparatus according to one or several of the preceding items 1 to 12,
comprising an analysis unit FV,
wherein the analysis unit FV is suitable or provided for delaying or time-shifting the control signals G1 to Gn or their generation depending on at least one of the aforementioned measured time durations such that the edge detector FD does no longer detect any edges.

14. The apparatus according to one or several of the preceding items 1 to 13,
comprising an analysis unit FV,
wherein the analysis unit FV is suitable or provided for delaying or time-shifting the control signals G1 to Gn or their generation depending on at least one of the aforementioned measured time durations such that the respective time duration is minimized or its amount does not exceed a predefined time value.

15. The apparatus according to one or several of the preceding items 1 to 14,
comprising an analysis unit FV,
wherein the analysis unit FV is suitable or provided for delaying or preponing the switching-on edge or the switching-off edge of a control signal G1 to Gn and/or another change of state of a control signal G1 to Gn depending on whether the first edge detected by the edge detector FD in a time interval is a positive or a negative edge.

16. The apparatus according to one or several of the preceding items 1 to 15,
comprising a diagnosis block DIAG,
wherein the diagnosis block DIAG generates or provides a fault signal if the edge detector FD does not detect an edge within a predefined time window temporally related to a time after a change of state of a control signal G1 to Gn.

17. The apparatus according to one or several of the preceding items 1 to 16,
comprising a diagnosis block DIAG,
wherein the diagnosis block DIAG does not generate or provide a fault signal if the edge detector FD does not detect a pair of two edges temporally succeeding each other within a predefined time window temporally related to a time after a change of state of a control signal G1 to Gn.

18. The apparatus according to item 17, wherein the time windows of signal pairs are cyclically exchanged for identifying multiple faults.

19. The apparatus according to one or several of the preceding items 1 to 18,
comprising an analysis unit FV,
wherein the analysis unit FV is suitable and/or provided for delaying or preponing the switching-on edge or the switching-off edge of a control signal G1 to Gn and/or another change of state of a control signal G1 to Gn, and
wherein the analysis unit FV includes a neural network model.

20. The apparatus according to one or several of the preceding items 1 to 19, comprising a diagnosis block DIAG, wherein the diagnosis block DIAG includes a neural network model.

21. The apparatus according to one or several of the preceding items 1 to 20, wherein the input signal of the edge detector FD is galvanically separated from the star point SP.

22. An apparatus for switched control of a plurality of loads RL1 to RLn,
comprising switching elements T1 to Tn, and
comprising a switching signal generating unit CTR, and
comprising control signals G1 to Gn, and
comprising a measuring device, and
comprising an analysis unit FV,
wherein the switching elements T1 to Tn are configured and provided for respectively connecting one or a plurality of loads RL1 to RLn to a supply unit V and/or a star point SP or a reference potential GND and disconnecting them, and
wherein the switching signal generating unit CTR controls the switching elements T1 to Tn with the control signals G1 to Gn. and
wherein the measuring device acquires operating condition data of the apparatus, and
wherein the analysis unit FV is suitable and/or provided for delaying or preponing the switching-on edge or the switching-off edge of a control signal G1 to Gn and/or another change of state of a control signal G1 to Gn, and
wherein the analysis unit FV includes a neural network model, and
wherein the analysis unit FV uses acquired operating condition data as an input for the neural network.

23. The apparatus according to claim 22, wherein the apparatus comprises an evaluator block which checks and/or changes the parameters of such a neural network model during operation.

24. The apparatus according to item 22 or 23, wherein the apparatus comprises a safety evaluator block which recognizes and prevents obviously faulty and possibly safety-relevant changes of the commutation before they are carried out.

25. The apparatus according to item 24, wherein the safety evaluator block changes the parameters of such a neural network model during operation in the case of attempted obviously faulty and possibly safety-relevant changes of the commutation by the neural network model.

26. An apparatus for switched control of a plurality of loads RL1 to RLn,
comprising switching elements T1 to Tn, and
comprising a switching signal generating unit CTR, and
comprising control signals G1 to Gn, and
comprising a measuring device, and
comprising an analysis unit FV,
wherein the switching elements T1 to Tn are configured and provided for respectively connecting one or a plurality of loads RL1 to RLn to a supply unit V and/or a star point SP or a reference potential GND and disconnecting them, and
wherein the switching signal generating unit CTR controls the switching elements T1 to Tn with the control signals G1 to Gn. and wherein the measuring device acquires operating condition data of the apparatus, and wherein the analysis unit FV is suitable and/or provided for delaying or preponing the switching-on edge or the switching-off edge of a control signal G1 to Gn and/or another change of state of a control signal G1 to Gn, and wherein the analysis unit FV includes a statistical model for calculating time sequence patterns and/or for predicting time sequences, and wherein the analysis unit FV uses acquired operating condition data as an input for the statistical model.

27. The apparatus according to item 26, wherein the statistical model is an HHM model or a neural network model.

28. The apparatus according to item 26 or 27, wherein the apparatus comprises an evaluator block which checks and/or changes the parameters of such a statistical model during operation.

29. The apparatus according to one or several of items 26 to 28, wherein the apparatus comprises a safety evaluator block which recognizes and prevents obviously faulty and possibly safety-relevant changes of the commutation before they are carried out.

30. The apparatus according to item 29, wherein the safety evaluator block changes the parameters of such a statistical model during operation in the case of attempted obviously faulty and possibly safety-relevant changes of the commutation by the statistical model.

31. A measuring device for an apparatus according to one or several of the preceding items 1 to 30, comprising a conductor, and comprising a first winding 1, and comprising a second winding 2, and comprising a regulation unit, and comprising a magnetic field probe, and wherein the conductor and the first winding 1 and the second winding 2 are magnetically connected to each other, and wherein the conductor is provided and/or destined for being connected as a common measuring means $Z_g$ between the star point SP and the reference potential GND, and wherein the magnetic field probe detects the magnetic field of the current flowing through the conductor and the magnetic field of the windings as a magnetic field measuring value.

wherein the regulator generates, with the aid of the magnetic field measuring value, a countercurrent flowing through the first winding 1 and compensates, with the aid of the first winding, for the magnetic field of the conductor with a first time constant, and wherein the second winding 2 is destined and provided for being utilized as a current measuring element $Z_g$ for the edge detector FD with a second time constant, and wherein the second time constant is smaller than the first time constant.

32. An apparatus for switched control of a plurality of loads RL1 to RLn, comprising a sub-device for controlling these loads.

wherein the sub-device includes a statistical model, and wherein the statistical model is an HMM model or a neural network model.

33. A method for operating an apparatus for switched control of a plurality of loads RL1 to RLn, comprising switching elements T1 to Tn, and comprising a star point SP, and comprising a reference potential GND, wherein the switching elements T1 to Tn are configured and provided for respectively connecting one or a plurality of loads RL1 to RLn to a supply unit V and/or the star point SP and disconnecting them, and comprising the steps of:

detecting a current from the star point SP to the reference potential GND, detecting edges in the current from the start point SP to the reference potential GND and generating respective information, and using this information for the operation of the apparatus.

34. The method according to item 33, wherein the information is used for the control of the switching elements.

35. The method according to item 34, wherein the point of time of a change of state of one of the switching elements T1 to Tn depends on this information.

36. The method according to item 35, comprising the following step of changing the detection time of at least one edge such that the latter is no longer detectable due to an interaction with another edge.

37. The method according to one or several of items 33 to 36, comprising the following step of using the information for recognizing a fault condition.

38. An apparatus for switched control of a plurality of loads load1 . . . loadn, comprising switching elements, a corresponding switching signal generating unit which controls the individual switching elements at staggered intervals, and a common current measuring element and an edge detector at the current measuring element and a means which measures the duration from the beginning of the generated switching signal at a point of the control to the beginning of the edge detected at the edge detector.

39. The apparatus according to item 38, wherein the direction of the edge is additionally taken into account or determined.

40. An apparatus for switched control of a plurality of loads load1 . . . loadn, comprising switching elements, a corresponding switching signal generating unit which controls the individual switching elements at staggered intervals, and a common current measuring element and an edge detector at the current measuring element and a means which measures the duration of an interference signal measured at the edge detector, wherein the interference signal is a short sequence of rising and falling edges.

41. An apparatus for switched control of a plurality of loads load1 . . . loadn, comprising switching elements, a corresponding switching signal generating unit which controls the individual switching elements at staggered intervals, and a common current measuring element, an edge detector at the current measuring element and a means which, when a specific switching signal event occurs at the switching signal generating unit or with a specific delay to this switching signal event, generates a time window which closes again after a specific time period.

42. An apparatus for switched control of a plurality of loads load1 . . . loadn, comprising switching elements, a corresponding switching signal generating unit which controls the individual switching elements at staggered intervals, and a common current measuring element and an edge detector at an additional output of the current measuring element and a means which measures the duration from the beginning of the generated switching signal at a point of the control to the beginning of the edge detected at the edge detector.

43. The apparatus according to item 42, wherein the direction of the edge is additionally taken into account or determined.

44. An apparatus for switched control of a plurality of loads load1 . . . loadn, comprising switching elements, a corresponding switching signal generating unit which controls the individual switching elements at staggered intervals, and a common current measuring element and an edge detector at an additional output of the current measuring element and a means which measures the duration of an interference signal measured at the edge detector, wherein the interference signal is a short sequence of rising and falling edges.

45. An apparatus for switched control of a plurality of loads load1 . . . loadn, comprising switching elements, a corresponding switching signal generating unit which controls the individual switching elements at staggered intervals, and a common current measuring element and an edge detector at an additional output of the current measuring element and a means which, when a specific switching signal event occurs at the switching signal generating unit or with a specific delay to this switching signal event, generates a time window which closes again after a specific time period.

46. An apparatus for switched control of a plurality of loads load1 . . . loadn, comprising switching elements, a corresponding switching signal generating unit which controls the individual switching elements at staggered intervals, and a common current measuring element and an edge detector at an additional element which is suitable for converting a change of current in the line into a signal suitable for edge detection (in particular an inductivity or a counter-inductivity), and a means which measures the duration from the beginning of a generated switching signal at a point of the control to the beginning of the edge detected at the edge detector.

47. The apparatus according to item 46, wherein the direction of the edge is additionally taken into account or determined.

48. An apparatus for switched control of a plurality of loads load1 . . . loadn, comprising switching elements, a corresponding switching signal generating unit which controls the individual switching elements at staggered intervals, and a common current measuring element and an edge detector at an additional element which is suitable for converting a change of current in the line into a signal suitable for edge detection (in particular an inductivity or a counter-inductivity), and a means which measures the duration of an interference signal measured at the edge detector, wherein the interference signal is a short sequence of rising and falling edges.

49. An apparatus for switched control of a plurality of loads load1 . . . loadn, comprising switching elements, a corresponding switching signal generating unit which controls the individual switching elements at staggered intervals, and a common current measuring element and an edge detector at an additional element which is suitable for converting a change of current in the line into a signal suitable for edge detection (in particular an inductivity or a counter-inductivity), and a means which, when a specific switching signal event occurs at the switching signal generating unit or with a specific delay to this switching signal event, generates a time window which closes again after a specific time period.

50. The apparatus according to at least one of the preceding items 38, 39, 42, 43, 46 or 47, comprising a device for edge shifting which delays, depending on the measured duration, the switching signals such that the differences of the delay times attributable to component variation e.g. in the switching elements are compensated for and the switching-on and switching-off edges exactly coincide with each other.

51. The apparatus according to at least one of items 40, 44 or 48, comprising a device for edge shifting which shifts, depending on the duration of the measured interference signal, the switching-on edge and/or switching-off edge such that the measured duration is minimized or does not exceed a predefined value.

52. The apparatus according to item 50, wherein, depending on whether the first edge of the interference signal is a positive or a negative edge, the switching-on edge or the switching-off edge is temporally delayed.

53. The apparatus according to at least one of items 38 to 49, comprising a device for diagnosing which generates a fault signal if the edges determined according to any one of items 38 to 49 have not occurred within a predefined maximum duration or within a predefined time window.

54. The apparatus according to at least one of items 38 to 50, comprising a device for diagnosing which generates a fault signal if the edges determined according to any one of items 38 to 49 have not occurred within a predefined maximum duration or within a predefined time window.

55. The apparatus according to item 53, wherein the non-detection of an edge pair is evaluated as a normal case by the apparatus.

56. The apparatus according to item 53, wherein the time windows of signal pairs are cyclically exchanged for better identifying multiple faults.

LIST OF REFERENCE NUMERALS

A+ Output of the edge detector for rising edges
A− Output of the edge detector for falling edges
ANA Analysis unit
ANS Control unit
C Capacity of the high-pass filter (DC filter)
CB Control bus
CMP1 First comparator
CMP2 Second comparator
CTR Switching signal generating unit for the n switching signals of the n switches or transistors
DEF Differentiated input signals of the edge detector
DIAG Diagnosis block
EF Input of the edge detector
FD Edge detector
FDS (e.g. edge) detector signal
FV Edge shifting block
G1 Control signal for the first switching element
G2 Control signal for the second switching element
G3 Control signal for the third switching element
G4 Control signal for the fourth switching element
Gn Control signal for the nth switching element
GND Reference potential
IC Integrated circuit
LZW Load branches
ML Measuring inductivity
MS Current measuring signal
OP1 Amplifier
PA Parallel circuit
Ref+ Reference value for the rising edge
Ref− Reference value for the falling edge R1, R2 Resistance divider
RL1 Load in the first load branch, which is switched by the first switching element
RL2 Load in the second load branch, which is switched by the second switching element
RL3 Load in the third load branch, which is switched by the third switching element
RL4 Load in the nth load branch, which is switched by the fourth switching element
RLn Load in the first load branch, which is switched by the nth switching element
SP Star point of the n load branches
Sh Shunt resistor
T1 Switching element (transistor) for the first load branch
T2 Switching element (transistor) for the second load branch
T3 Switching element (transistor) for the third load branch
T4 Switching element (transistor) for the fourth load branch
Tn Switching element (transistor) for the nth load branch
V Supply unit (or supply voltage line with an operating voltage relative to the potential)
VER Electric consumer load
ZFV Device for time shifting
$Z_g$ Common current measuring means for all n load branches

LIST OF CITED DOCUMENTS

DE-A 100 41 880
EP-A 0 198 222
DE-A 10 2020 033 633

What is claimed is:

1. An apparatus for analyzing currents in an electric consumer load, comprising:
a parallel circuit made up of a plurality of load branches, wherein each load branch comprises a respective electric load and a controllable switching element for optionally switching the respective load on and off, and
a control unit for generating control signals for the respective switching elements, wherein the apparatus comprises:
a current measuring circuit connectable in series with the parallel circuit of the load branches of the electric consumer load for measuring a current flowing through the parallel circuit,
a detector for detecting a switching edge of the current flowing through the parallel circuit during a switching-on or off or due to the switching-on or switching-off of the switching element of the respective load branch, the detector being an edge detector that generates an output signal upon detecting a voltage transition at an input, the output signal indicating the detection of the voltage transition,
an analysis unit connected to the control unit and the detector and analyzing:
a time correlation of the control signal for switching-on or for switching-off of the switching element of the respective load branch with the detection of the switching edge of the current flowing through the parallel circuit due to the switching-on and/or the switching-off of the respective switching element, and/or
the switching edge of the current flowing through the parallel circuit at several points of time of the switching-on and/or the switching-off of the respective switching element of the respective load branch or the switching elements of a plurality of the load branches, wherein the plurality of load branches can include all of the load branches, and
wherein the analysis unit comprises a diagnosis component which generates a fault message if no interference pulse with a positive polarity follows the switching-on of the switching element of one of the load branches within a predefined time window and/or if no interference pulse with a negative polarity follows the switching-off of the switching element of one of the load branches within the predefined time window.

2. The apparatus according to claim 1, wherein the analysis unit analyzes a type of the switching edge of the current in terms of a time course of the switching edge and/or a change of the time correlation of the control signal for the switching-on or for the switching-off of the switching element of the respective load branch with the detection of the switching edge of the current due to the switching-on and/or the switching-off of the respective switching element.

3. The apparatus according to claim 2, wherein the analysis unit analyzes a mathematical derivation of first order and/or second order and/or higher order of the switching edge of the current and/or an integral across the switching edge of the current and/or a magnitude and a direction of the switching edge of the current.

4. The apparatus according to claim 1, wherein the analysis unit comprises a data processing unit which, on a basis of a data base in which data are saved informing about which events concerning an operation of the electric consumer load are to be respectively associated with various results of the analysis of the analysis unit, produces and/or signals, like statistical models, in particular an HMM model or an artificial neural network model, control signals for the switching elements of the load branches of the electric consumer load or for its control unit when the analysis performed by the analysis unit indicates a potential or real fault in the electric consumer load.

5. The apparatus according to claim 1, wherein the current measuring circuit comprises a measuring inductivity and that the detector detects the switching edge of the current as an interference pulse occurring across or at or due to the measuring inductivity, taking into account a polarity of the interference pulse.

6. The apparatus according to claim 5, wherein the analysis unit analyzes whether an amount of the interference pulse is larger than a predefined minimum level and/or lies within a range between the predefined minimum level and a predefined maximum level.

7. The apparatus according to claim 5, wherein the detector is configured as an edge detector for detecting rising or falling edges of the interference pulse across measuring inductivity each having a respective predefined minimum level.

8. The apparatus according to claim 1, wherein the current measuring circuit is configured as a shunt resistor which comprises an inductivity as a parasitic component.

9. The apparatus according to claim 1, wherein the analysis unit analyzes whether an interference pulse with a positive polarity follows the switching-on of the switching element of one of the load branches within a predefined time window and/or whether an interference pulse with a negative polarity follows the switching-off of the switching element of one of the load branches within the predefined time window.

10. An apparatus for analyzing currents in an electric consumer load, comprising:
a parallel circuit made up of a plurality of load branches wherein each load branch comprises a respective electric load and a controllable switching element for optionally switching the respective load on and off, and a control unit for generating control signals for the respective switching elements, wherein the apparatus comprises:
a current measuring circuit, connectable in series with the parallel circuit of the load branches of the electric consumer load for measuring a current flowing through the parallel circuit,
a detector for detecting a switching edge of the current flowing through the parallel circuit during a switching-on or off or due to the switching-on or switching-off of the switching element of the respective load branch, the detector being an edge detector that generates an output signal upon detecting a voltage transition at an input, the output signal indicating the detection of the voltage transition,
an analysis unit connected to the control unit and the detector and analyzing:
a time correlation of the control signals for switching-on or for switching-off of the switching element of the respective load branch with the detection of the switching edge of the current flowing through the parallel circuit due to the switching-on and/or the switching-off of the respective switching element, and/or
the switching edge of the current flowing through the parallel circuit at several points of time of the switching-on and/or the switching-off of the respective switching element of the respective load branch or the switching elements of a plurality of the load branches,
wherein the plurality of load branches can include all of the load branches, and wherein, when the control unit for the switching elements of the load branches of the electric consumer load controls the switching elements of two respective load branches such that the switching-off of the switching element of a first one of the two load branches is performed simultaneously with the switching-on of the switching element of a second one of the two load branches, an evaluation unit analyzes whether no interference pulse with a positive polarity follows the switching-on of the switching element of the first one load branch within a predefined time window and/or whether no interference pulse with a negative polarity follows the switching-off of the switching element of the other second one of the two load branches within the predefined time window.

11. The apparatus according to claim 1, wherein, when an interference pulse with a positive polarity follows the switching-on of the switching element of one of the load branches within a predefined time window and/or an interference pulse with a negative polarity follows the switching-off of the switching element of one of the load branches within the predefined time window, the analysis unit controls a switching element control unit such that it performs a time shifting of the control signals for a purpose of a simultaneous, alternate switching-on and off as well as switching-off and on of the switching elements of the respective two load branches of the electric consumer load.

12. The apparatus according to claim 11, wherein the switching-on control signal of the control unit for switching on the switching element of the respective load branch comprises a rising switching edge and the switching-off control signal of the control unit for switching-off the switching element of the respective load branch comprises a falling switching edge.

13. The apparatus according to claim 11, wherein the switching element control unit comprises a device for the time shifting of a rising edge of the switching-on control signal and/or for the time shifting of a falling edge of the switching-off control signal.

14. The apparatus according to claim 1, wherein the switching elements of the load branches of the electric consumer load form a part of the apparatus.

15. An electric consumer load comprising:
a parallel circuit made up of a plurality of load branches, wherein each load branch comprises a respective electric load and a controllable switching element for optionally switching the load on and off, and
a control unit for generating control signals for the switching elements, and
the apparatus for analyzing the switching edges of currents according to claim 1.

16. The apparatus according to claim 1, further comprising:
a current measurement amplifier configured to measure a current through the parallel circuit and provide a current measurement signal to the analysis unit, wherein the current measurement amplifier is distinct from, and in addition to the detector for detecting a switching edge.

17. The apparatus according to claim 10, wherein the analysis unit analyzes a type of the switching edge of the current in terms of a time course of the switching edge and/or a change of the time correlation of the control signals for the switching-on or for the switching-off of the switching element of the respective load branch with the detection of the switching edge of the current due to the switching-on and/or the switching-off of the respective switching element.

18. The apparatus according to claim 10, wherein the analysis unit analyzes a mathematical derivation of first order and/or second order and/or higher order of the switching edge of the current and/or an integral across the switching edge of the current and/or a magnitude and a direction of the switching edge of the current.

19. The apparatus according to claim 10, wherein the analysis unit comprises a data processing unit which, on a basis of a data base in which data are saved informing about which events concerning an operation of the electric consumer load are to be respectively associated with various results of the analysis of the analysis unit, produces and/or signals, like statistical models, in particular an HMM model or an artificial neural network model, control signals for the switching elements of the load branches of the electric consumer load or for its control unit when the analysis performed by the analysis unit indicates a potential or real fault in the electric consumer load.

20. The apparatus according to claim 10, wherein the current measuring circuit comprises a measuring inductivity and that the detector detects the switching edge of the current as an interference pulse occurring across or at or due to the measuring inductivity, taking into account a polarity of the interference pulse.

* * * * *